US010962297B2

(12) United States Patent
Agonafer et al.

(10) Patent No.: US 10,962,297 B2
(45) Date of Patent: Mar. 30, 2021

(54) MULTIDIMENSIONAL HEAT TRANSFER SYSTEM FOR COOLING ELECTRONIC COMPONENTS

(75) Inventors: Dereje Agonafer, Arlington, TX (US); Huy N. Phan, Fort Worth, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 1443 days.

(21) Appl. No.: 13/400,704

(22) Filed: Feb. 21, 2012

(65) Prior Publication Data

US 2012/0211204 A1    Aug. 23, 2012

Related U.S. Application Data

(60) Provisional application No. 61/444,905, filed on Feb. 21, 2011.

(51) Int. Cl.
| *F28F 7/00* | (2006.01) |
| *F28D 15/00* | (2006.01) |
| *F28D 15/02* | (2006.01) |
| *H01L 23/427* | (2006.01) |
| *H01L 23/473* | (2006.01) |
| *H01L 23/38* | (2006.01) |

(52) U.S. Cl.
CPC .......... *F28D 15/0266* (2013.01); *H01L 23/38* (2013.01); *H01L 23/427* (2013.01); *H01L 23/473* (2013.01); *H01L 2924/0002* (2013.01)

(58) Field of Classification Search
CPC ............... F25B 21/00; F25B 2321/025; F25B 2321/0252; H01L 23/427; H01L 23/473; F28D 15/0233

USPC .................... 62/3.6, 3.1, 3.2, 376, 259.2
See application file for complete search history.

(56) References Cited

U.S. PATENT DOCUMENTS

| 5,419,780 | A | * | 5/1995 | Suski | ............... H01L 23/38 136/201 |
| 5,456,081 | A | | 10/1995 | Chrysler | |
| 5,457,342 | A | * | 10/1995 | Herbst, II | ............ H01L 23/38 257/712 |
| 6,263,957 | B1 | | 7/2001 | Chen | |
| 6,343,478 | B1 | * | 2/2002 | Chang | ................ G06F 1/20 257/E23.098 |
| 6,370,884 | B1 | * | 4/2002 | Kelada | ............. B67D 1/0869 62/3.3 |
| 6,567,262 | B2 | * | 5/2003 | Meir | ................ G06F 1/20 361/676 |
| 6,581,388 | B2 | | 6/2003 | Novotny | |
| 6,741,465 | B2 | | 5/2004 | Holalkere | |

(Continued)

*Primary Examiner* — Jianying C Atkisson
*Assistant Examiner* — Meraj A Shaikh
(74) *Attorney, Agent, or Firm* — FisherBroyles LLP; Anthony J DoVale

(57) ABSTRACT

Devices, methods, and systems for facilitating heat transfer and cooling electronic components are presented. A system for cooling an electronic component includes a cold core, a plurality of solid state cooling devices, and a plurality of heat sinks. The cold core may define one or more cavities for receiving electronic components. The system may include an air mover and a duct. In operation, the system may cool an electronic component to sub-ambient temperatures. In other embodiments, the system may include multiple cold cores connected by liquid conduits for facilitating a flow of a cooling fluid.

20 Claims, 6 Drawing Sheets

(56) References Cited

U.S. PATENT DOCUMENTS

| | | | |
|---|---|---|---|
| 6,798,659 B2 * | 9/2004 | Chen | H01L 23/38 |
| | | | 165/121 |
| 6,813,149 B2 | 11/2004 | Faneuf | |
| 6,836,407 B2 | 12/2004 | Faneuf | |
| 6,965,513 B2 | 11/2005 | Montgomery | |
| 7,059,137 B2 * | 6/2006 | Childress | B60H 1/00264 |
| | | | 62/259.2 |
| 7,100,677 B2 | 9/2006 | Lee | |
| 7,115,987 B2 | 10/2006 | Holalkere | |
| 7,156,160 B2 | 1/2007 | Lee | |
| 7,402,048 B2 | 7/2008 | Meier | |
| 7,537,048 B2 | 5/2009 | Liu | |
| 7,604,040 B2 | 10/2009 | Ghosh | |
| 8,358,503 B2 * | 1/2013 | Carter | G06F 1/181 |
| | | | 361/690 |
| 2003/0042153 A1 * | 3/2003 | Farrar | H01L 25/0652 |
| | | | 206/100 |
| 2005/0011199 A1 * | 1/2005 | Grisham | F25B 21/02 |
| | | | 62/3.7 |
| 2005/0252228 A1 * | 11/2005 | Su | F25B 21/02 |
| | | | 62/259.2 |
| 2007/0204627 A1 * | 9/2007 | Pan | F25B 21/02 |
| | | | 62/3.2 |
| 2007/0204628 A1 * | 9/2007 | Pan | F25B 21/02 |
| | | | 62/3.2 |
| 2007/0291234 A1 * | 12/2007 | Momose | F25B 21/02 |
| | | | 353/52 |

* cited by examiner

MULTIDIMENSIONAL HEAT TRANSFER SYSTEM FOR COOLING ELECTRONIC COMPONENTS

CROSS-REFERENCE TO RELATED APPLICATIONS

This application claims the benefit of and priority to U.S. Provisional Application No. 61/444,905, entitled "Multidimensional Sub-Ambient System and Apparatus for Heat Transfer," filed Feb. 21, 2011, which is herein incorporated by reference in its entirety.

BACKGROUND

The following disclosure relates generally to heat transfer systems for cooling electronic components. Electronic components such as microchips and microprocessors generate large amounts of heat relative to their size during normal operation. As processor speed increases, the concomitant increase in heat energy represents a serious design challenge. Moreover, the current trend toward the miniaturization of electronic devices means that less physical space is available for cooling systems.

The semiconductor industry is also developing three-dimensional integrated circuits in which several microchips are placed together in a stack. Stacked chips further concentrate the generation of heat energy in a smaller space, creating a greater need for a better cooling performance in a smaller space.

The accumulation of heat energy is a serious limiting factor on the overall speed and performance of electronic devices. Existing systems are either too large for the physical space available or fail to provide satisfactory cooling performance.

SUMMARY

A system for cooling electronic components, according to various embodiments, comprises: (1) a cold core in thermal communication with the electronic component, the cold core comprising a base, a generally opposing top, and at least one side surface; (2) a plurality of solid state cooling devices each in thermal communication with the cold core; and (3) a plurality of heat sinks each in thermal communication with one of the plurality of solid state cooling devices. In particular embodiments, the cold core comprises a three-dimensional shape selected from the group consisting of cube, polyhedron, prism, rectangular prism, cylindrical prism, pyramid, and amorphous. The base of the cold core, in particular embodiments, defines a cavity that is sized and shaped to receive the electronic component. In particular embodiments, the system further comprises an air mover and/or a duct, positioned to direct at least a portion of the flow of air adjacent one or more of the plurality of heat sinks.

According to a further embodiment, a system for cooling electronic components comprises: (1) a primary cold core in thermal communication with an electronic component, the primary cold core comprising a base, a generally opposing top, and at least one side surface; (2) a plurality of primary solid state cooling devices each in thermal communication with the primary cold core; (3) a plurality of primary heat sinks each in thermal communication with one of the plurality of primary solid state cooling devices; (4) a secondary cold core spaced apart from the primary cold core; (5) a plurality of secondary solid state cooling devices each in thermal communication with the secondary cold core; (6) a plurality of secondary heat sinks each in thermal communication with one of the plurality of secondary solid state cooling devices; and (7) one or more liquid conduits for facilitating the flow of a cooling fluid through a substantially closed circuit that extends between the secondary cold core and one or more of the primary heat sinks.

According to a further embodiment, a system for cooling electronic components comprises: (1) a local cold core in thermal communication with an electronic component, the local cold core comprising a base, a generally opposing top, and at least one side surface; (2) a plurality of local solid state cooling devices each in thermal communication with the local cold core; (3) a plurality of local heat sinks each in thermal communication with one of the plurality of local solid state cooling devices; (4) a remote cold core spaced apart from the local cold core; (5) a plurality of remote solid state cooling devices each in thermal communication with the remote cold core; (6) a plurality of remote heat sinks each in thermal communication with one of the plurality of remote solid state cooling devices; (7) one or more liquid conduits for facilitating the flow of a cooling fluid through a substantially closed circuit that extends from between the remote cold core and one or more of the heat sinks; and (8) a pump that is positioned and configured to cause the cooling fluid to flow through the substantially closed circuit, wherein one of the plurality of remote heat sinks comprises a radiator that is positioned between the remote cold core and one or more of the local heat sinks.

BRIEF DESCRIPTION OF THE DRAWING

Figure 1:
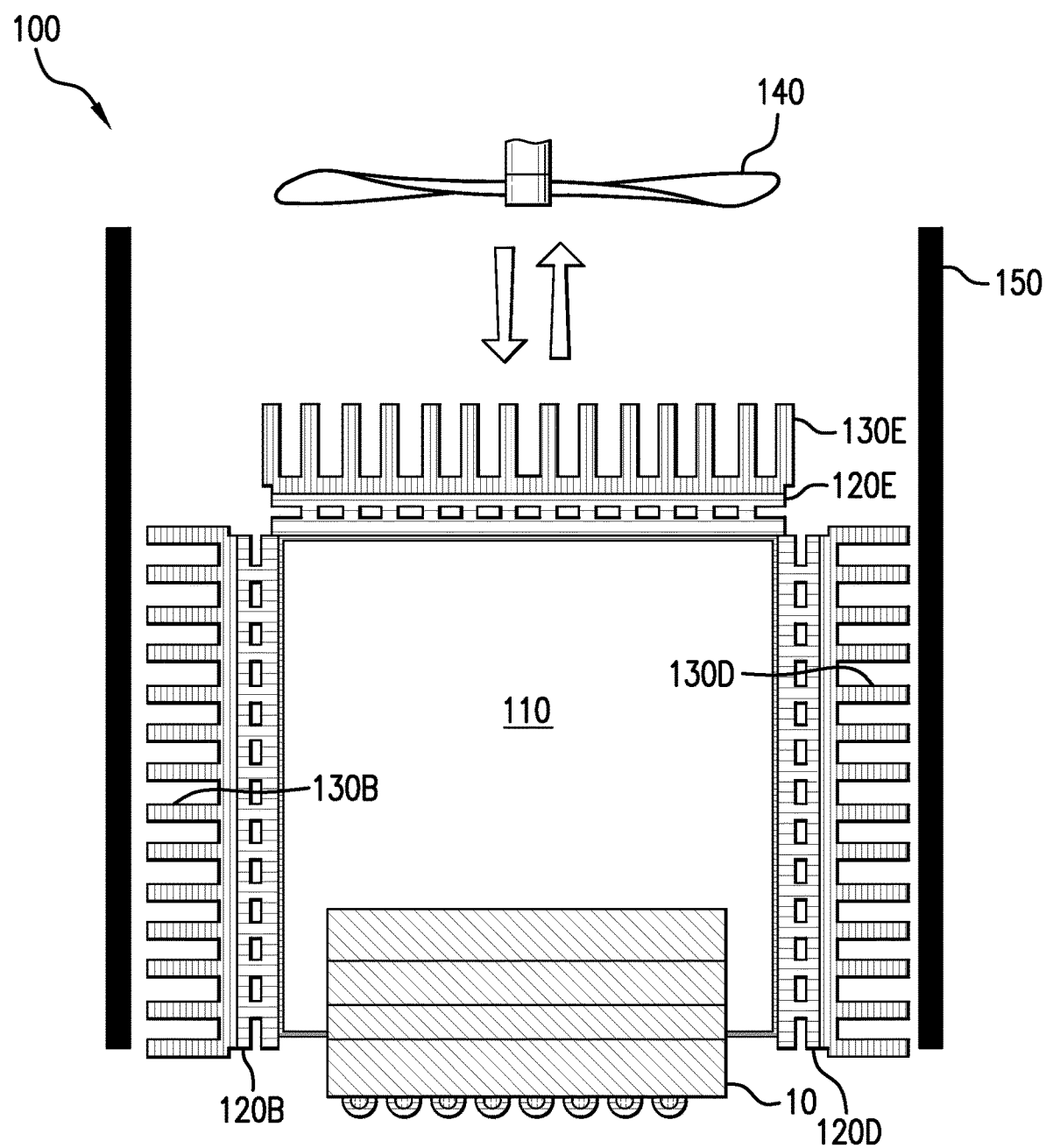

Having thus described various embodiments in general terms, reference will now be made to the accompanying drawings, which are not necessarily drawn to scale, and wherein:

FIG. 1 is a cross-sectional illustration of a heat transfer system according to a first embodiment.

Figure 2:
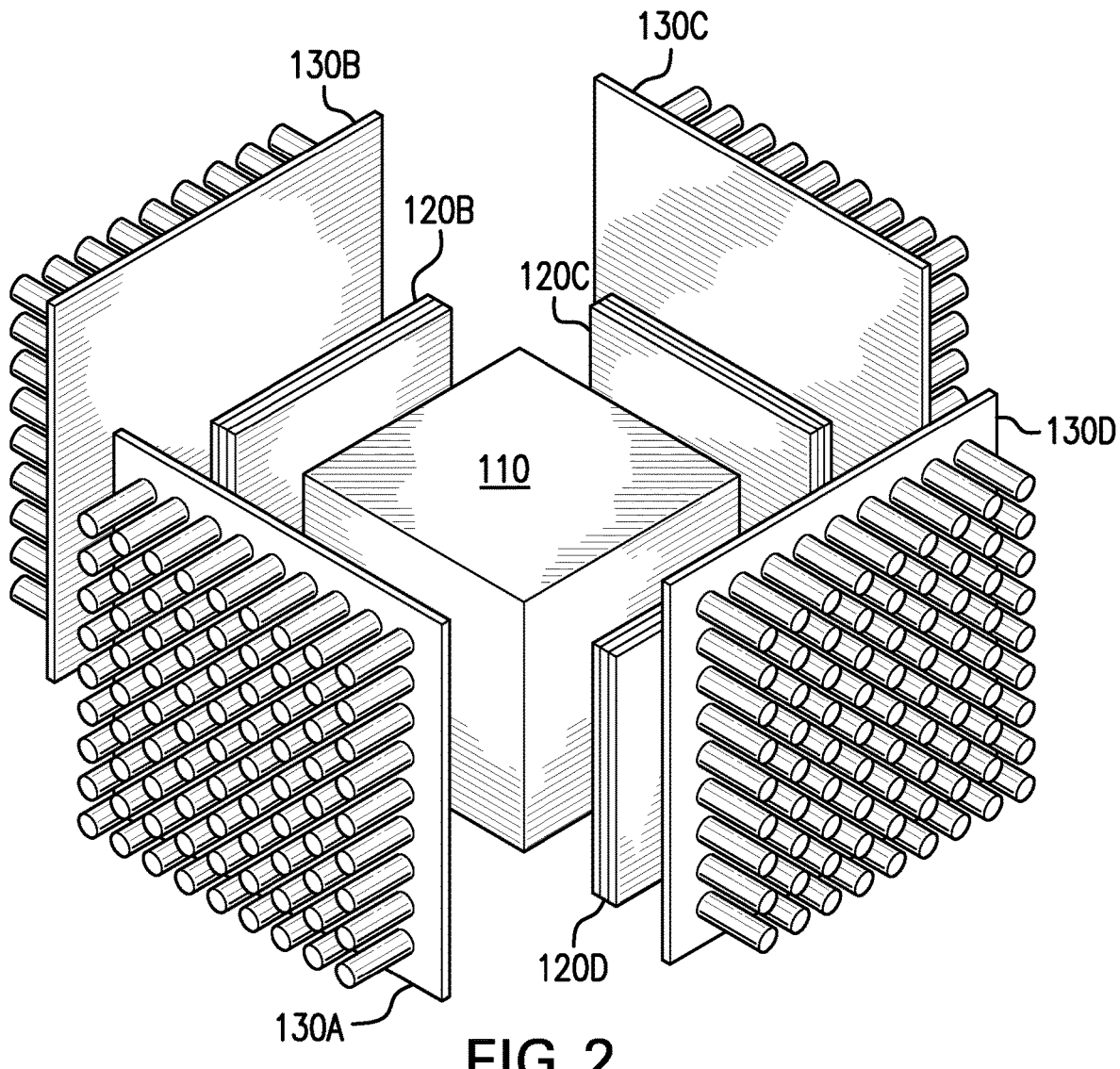

FIG. 2 is a perspective, exploded view of the heat transfer system of FIG. 1, from the side.

Figure 3:
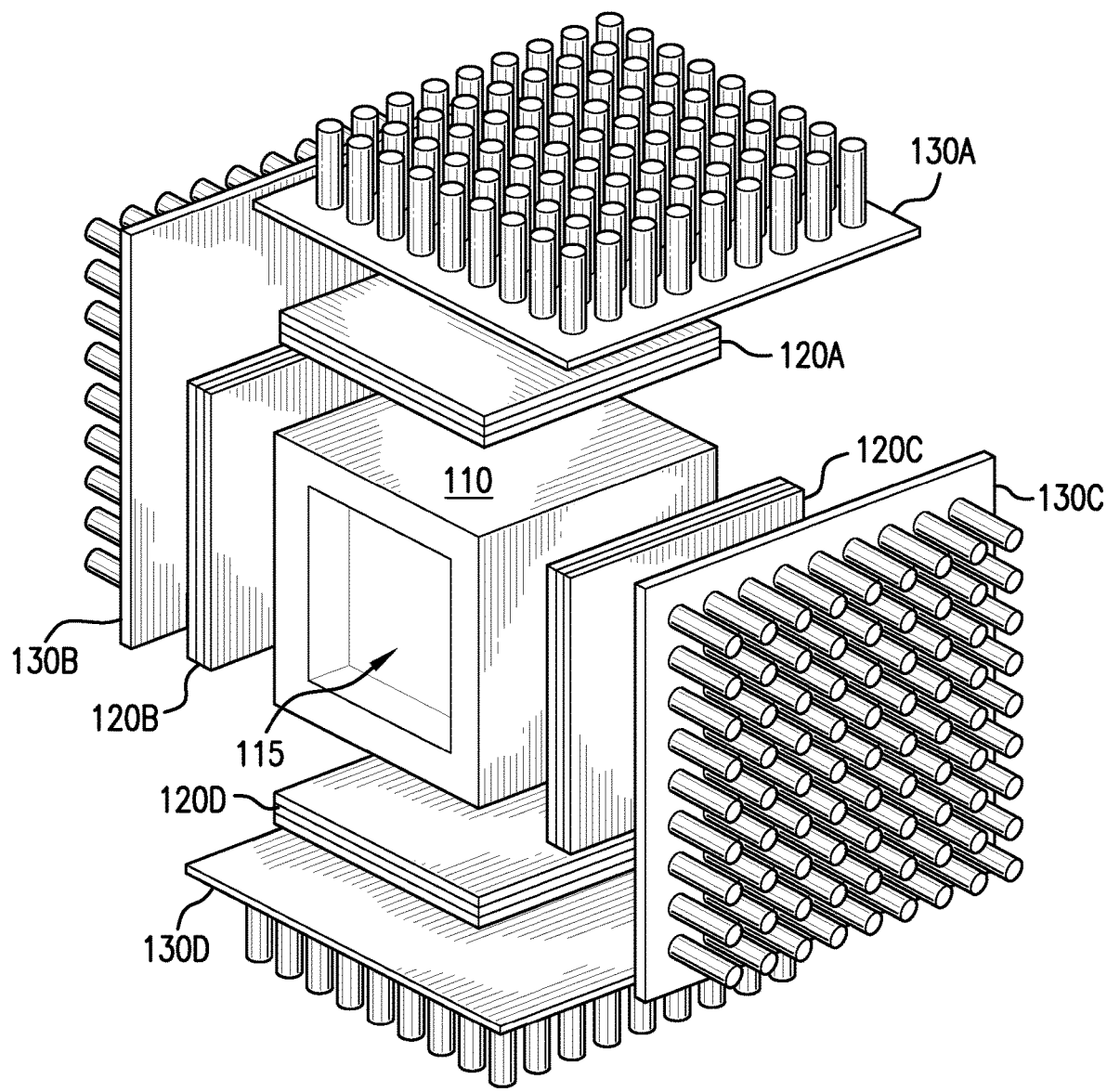

FIG. 3 is a perspective, exploded view of the heat transfer system of FIG. 1, from the bottom.

Figure 4:
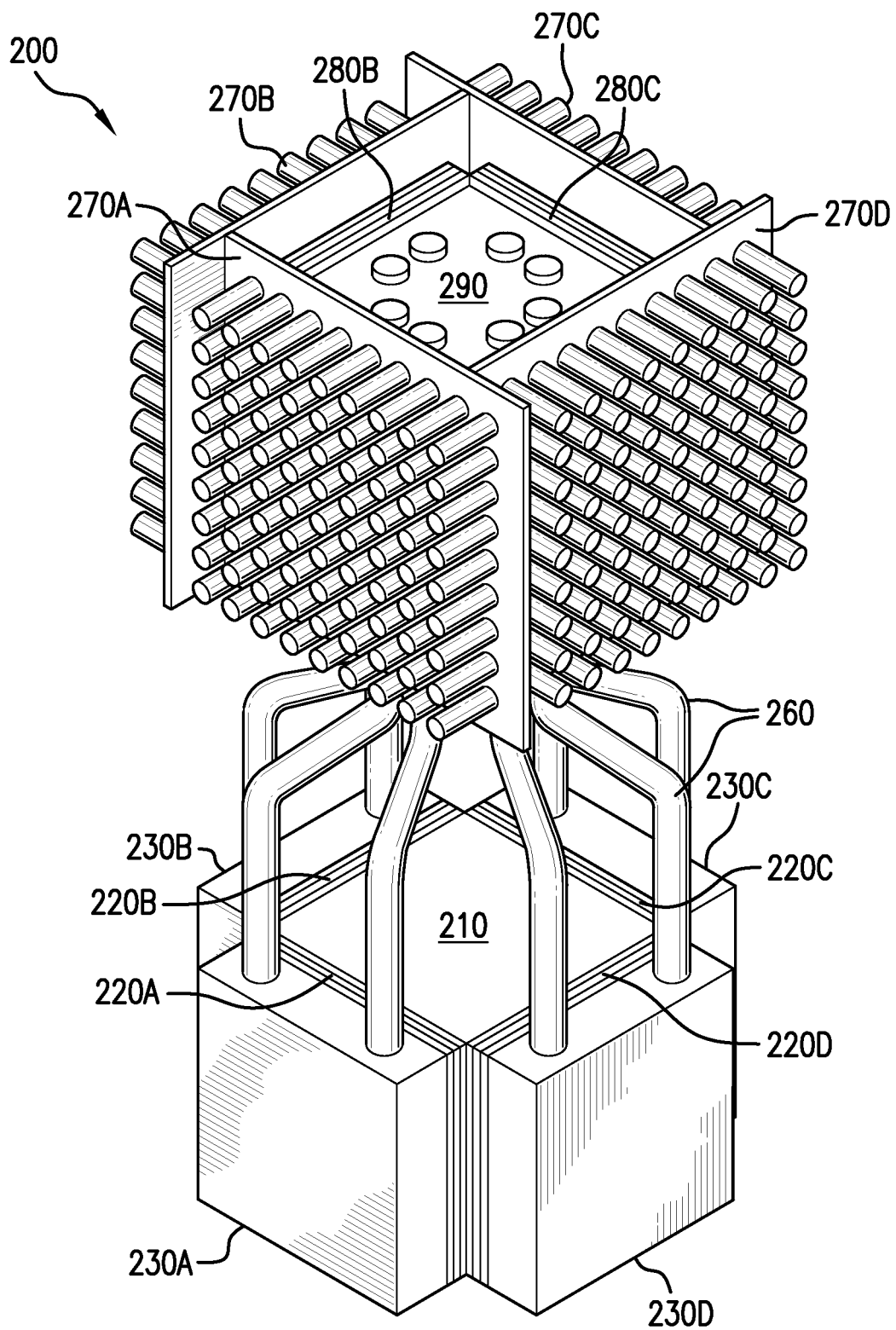

FIG. 4 is a perspective illustration of a heat transfer system according to a second embodiment.

Figure 5:
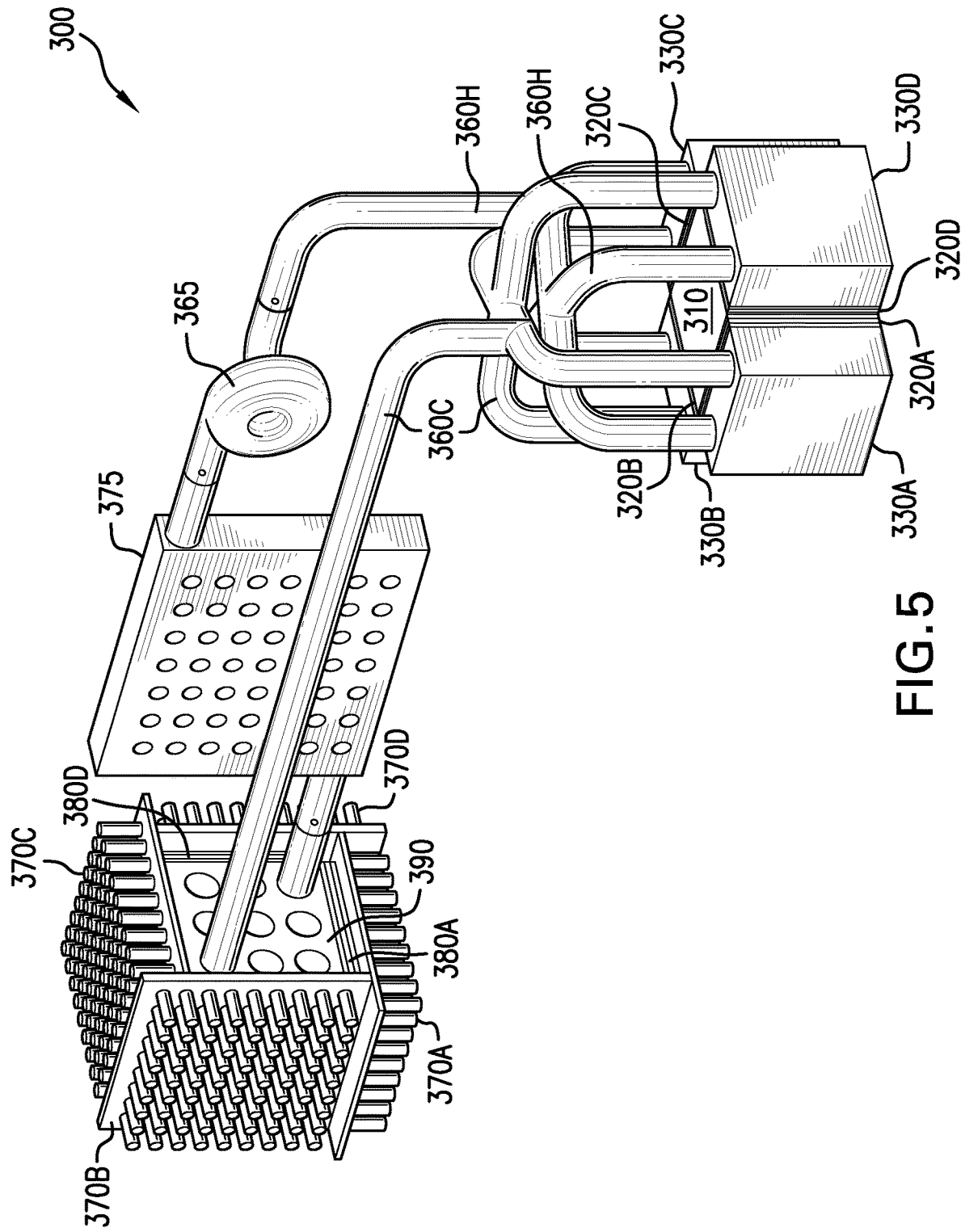

FIG. 5 is a perspective illustration of a heat transfer system according to a third embodiment.

Figure 6:
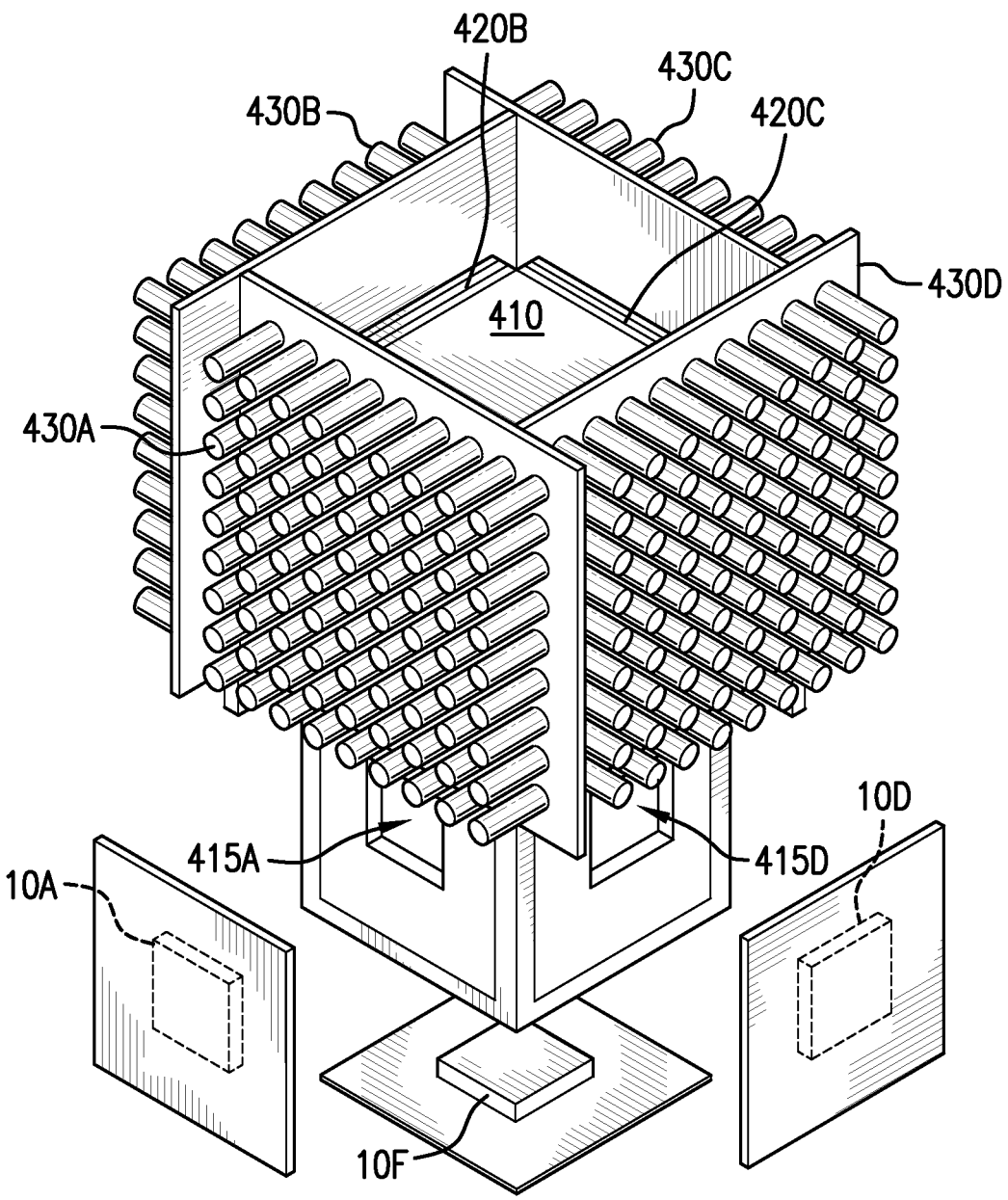

FIG. 6 is a perspective, partially exploded illustration of a heat transfer system according to a fourth embodiment.

DETAILED DESCRIPTION

The present systems and apparatuses and methods are understood more readily by reference to the following detailed description, examples, drawing, and claims, and their previous and following descriptions. However, before the present devices, systems, and/or methods are disclosed and described, it is to be understood that this invention is not limited to the specific devices, systems, and/or methods disclosed unless otherwise specified, as such can, of course, vary. It is also to be understood that the terminology used herein is for the purpose of describing particular aspects only and is not intended to be limiting.

The following description is provided as an enabling teaching in its best, currently known embodiment. To this end, those skilled in the relevant art will recognize and appreciate that many changes can be made to the various aspects described herein, while still obtaining the beneficial results of the technology disclosed. It will also be apparent that some of the desired benefits can be obtained by selecting some of the features while not utilizing others. Accordingly, those with ordinary skill in the art will recognize that many modifications and adaptations are possible, and may even be desirable in certain circumstances, and are a part of the invention described. Thus, the following description is provided as illustrative of the principles of the invention and not in limitation thereof.

As used throughout, the singular forms "a," "an" and "the" include plural referents unless the context clearly dictates otherwise. Thus, for example, reference to "a" component can include two or more such components unless the context indicates otherwise. Also, the words "proximal" and "distal" are used to describe items or portions of items that are situated closer to and away from, respectively, a user or operator. Thus, for example, the tip or free end of a device may be referred to as the distal end, whereas the generally opposing end or handle may be referred to as the proximal end.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Heat Transfer Systems

The following disclosure relates generally to heat transfer systems for cooling electronic components. According to various embodiments, a heat transfer system includes a cold core, a plurality of solid state cooling devices (such as thermoelectric modules, for example), and a plurality of heat sinks. These components cooperate in order to cool an electronic component; in various embodiments, to sub-ambient temperatures (i.e., below the temperature of the surrounding environment). The electronic component in various embodiments may include a plurality of components, such as one or more microchips, microprocessors, log boards, memory boards, stand-alone integrated circuits, and combinations or derivatives thereof.

The cold core, solid state cooling devices, and heat sinks may be in thermal communication with one another. Thermal communication between parts may be accomplished by using a thermal compound, a thermal pad, a thermal adhesive, or other substance that acts as a thermal interface. For embodiments where the solid state cooling device is a thermoelectric module, for example, a thin skim of thermal compound may be used between the cold side of the thermoelectric module and the outer wall of the cold core.

The cold core may include a base, a generally opposing top surface, and at least one side surface. In various embodiments, the base of the cold core defines a cavity that is sized and shaped to receive the electronic component. The cavity may be sized and shaped to a close tolerance relative to the size and shape of the electronic component. In various embodiments, any external surfaces of the cold core that are not in contact with a thermoelectric module, a heat sink, or another device may be thermally insulated.

The cold core may be any combination of sizes, shapes, and materials that is best suited for a particular system. For example, the cold core may be a cube made of copper, an excellent conductor of heat. The cold core may have an amorphous shape or a regular shape, such as a cube, polyhedron, prism or pyramid. The cold core may be made of a single material or several different materials. The cold core may be solid or liquid, or a combination of the two.

The components referred to herein as thermoelectric modules may include any type of solid state cooling device such as a Peltier device, Peltier heat pump, a solid state refrigerator, thermoelectric cooler (TEC), or thermal diode. The term "thermoelectric module" is used for convenience, and not as a limitation, because it is a common type of solid state cooling device. The thermoelectric modules may be substantially planar in shape or curved. They may be disposed on a flexible substrate. In one aspect, the thermoelectric modules may be selected to conform to the outer surface of the cold core. For example, a cube-shaped cold core has up to five outer surfaces where any number of thermoelectric modules can be placed.

The heat sinks may be passive or active. In the first embodiment, the heat sinks include a base plate and a plurality of fins. In a passive heat sink, heat is removed from the fins by natural convection and radiation. In an active heat sink, one or more portions of the heat sink, such as the base plate, may contain a fluid or vapor, in order to enhance more uniform heat transfer to the fins. The heat sinks may have base plates that are substantially planar in shape or curved. The heat sinks may be rigid or flexible. In one aspect, the heat sinks may be selected to conform to the outer surface or "hot side" of the thermoelectric modules. In this aspect, the heat sinks may cooperate with the thermoelectric modules in order to increase the heat transfer accomplished by the heat transfer system.

The heat transfer system may also include an air mover for producing a flow of air, or gas, or another fluid. The flow created by the air mover helps increase the effectiveness of the heat sinks. The air mover may be a fan, or any type of device capable of producing a desired flow. For example, one or more of the heat sinks may be a fanned heat sink, in which the air mover is an integral part of the heat sink. The space available, the geometry of nearby components, and the optimization of the desired heat transfer rate are some of the constraints that may influence the selection of an air mover best suited for a particular system. The heat transfer system may also include one or more ducts positioned to direct at least a portion of the flow of air toward a desired location. The duct may have substantially solid walls or may include a number of holes or perforations in order to facilitate a desired air flow pattern.

The heat transfer systems described herein may operate in a dry environment, where air or another gas surrounds the electronic components and the heat transfer system. The heat transfer systems described herein may also operate in a liquid environment, where a non-conductive fluid, for example, surrounds the electronic components and the heat transfer system.

First Embodiment

FIG. 1 is a cross-sectional illustration of an exemplary heat transfer system 100 according to a first embodiment. As shown, the heat transfer system 100 includes a cold core 110, a plurality of thermoelectric modules 120B, 120D, 120E, and a plurality of heat sinks 130B, 130D, 130E. The system 100 may be positioned atop an electronic component 10, such as the stacked chip shown.

The heat transfer system 100 may also include an air mover 140 for producing a flow of air. As shown, the heat transfer system 100 may also include a duct 150 positioned to direct at least a portion of the flow of air toward a desired location.

FIG. 2 is a perspective, exploded view of the heat transfer system 100 illustrated in FIG. 1. As shown, the heat transfer system 100 includes a cold core 110, four thermoelectric modules 120A (present but not seen), 120B, 120C, and 120D, and a corresponding set of four heat sinks 130A, 130B, 130C, and 130D. As shown, the upper external surface of the cold core 110 may be thermally insulated (not shown) because that surface is not in contact with a thermoelectric module, a heat sink, or any other device. In this aspect, any external surfaces of the cold core 110 that are not in contact with a thermoelectric module, a heat sink, or another device may be thermally insulated.

FIG. 3 is a perspective, exploded view of the heat transfer system 100 illustrated in FIG. 1, showing the bottom or base of the cold core 110. As shown, the base of the cold core 110 defines a cavity 115 for receiving the electronic component 10 (not shown) to be cooled. The cavity 115 may be sized and shaped to a close tolerance relative to the size and shape of the electronic component 10.

When the heat transfer system 100 of the first embodiment is in operation, the cold core 110 is positioned adjacent the electronic component 10 to be cooled so that the cold core 110 is in thermal communication with the electronic component 10. The cold core 110 in this aspect acts like a single monolithic fin of a heat exchanger, dissipating heat upward and outward, away from the component 10.

The plurality of thermoelectric modules 120 at least partially surround and are in thermal communication with the cold core 110. The thermoelectric modules 120 further dissipate the heat away from the cold core 110. In cooperation with the thermoelectric modules 120, the plurality of heat sinks 130 are positioned in thermal communication with one or more of the thermoelectric modules 120 in order to further dissipate the heat. The optional air mover 140 facilitates additional cooling by creating a flow of air across the heat sinks 130. The optional duct 150 directs the flow of air toward any desired location in and around the various components of the system 100.

Second Embodiment

FIG. 4 is a perspective illustration of a heat transfer system 200 according to a second embodiment. As shown, the heat transfer system 200 may include a primary cold core 210 and a secondary cold core 290. The primary cold core 210 and secondary cold core 290 may be arranged in a substantially vertical stack, as shown; or in a substantially horizontal stack. In operation, the system 200 may cool the electronic component 10 to sub-ambient temperatures.

The heat transfer system 200 may include a plurality of primary thermoelectric modules 220A, 220B, 220C, 220D in thermal communication with the primary cold core 210. The system 200 may also include a plurality of primary heat sinks 230A, 230B, 230C, 230D in thermal communication with the thermoelectric modules.

Similarly, the secondary cold core 290 may include a plurality of secondary thermoelectric modules 280A (not seen), 280B, 280C, 280D (not seen) and a plurality of secondary heat sinks 270A, 270B, 270C, 270D. The system 200 may also include an air mover (not shown) and/or a duct (not shown).

Any external surfaces of the primary cold core 210 and secondary cold core 290 that are not in contact with a thermoelectric module, a heat sink, or another device may be thermally insulated (not shown).

Instead of having fins and using primarily air to facilitate heat transfer, the primary heat sinks 230A, 230B, 230C, 230D in this second embodiment include embedded pipes through which a cooling fluid is circulated. As shown in FIG. 4, the heat transfer system 200 of the second embodiment may include one or more pipes or liquid conduits 260 for facilitating the flow of a cooling fluid between one or more of the primary heat sinks 230A, 230B, 230C, 230D and the secondary cold core 290. In this aspect, the cooling fluid increases the cooling efficiency of the primary heat sinks. The liquid conduits 260 may define a substantially closed circuit for the cooling fluid. The cooling fluid may flow in response to convection, radiation, capillary action, wicking, siphon action, or other natural force. Alternatively, the cooling fluid may be circulated by a mechanical force such as a pump (not shown). The liquid conduits may be generally cylindrical, as illustrated, or they may be partially flattened in cross-section, for example, in order to conserve space and/or otherwise promote the natural circulation of the cooling fluid. The liquid conduits may also include embedded fins on the interior, for example, to further facilitate heat transfer.

When the heat transfer system 200 of the second embodiment is in operation, the primary cold core 210 is positioned adjacent the electronic component 10 to be cooled. Heat dissipates through the primary cold core 210, through the primary thermoelectric modules 220A, 220B, 220C, 220D, and through the primary heat sinks 230A, 230B, 230C, 230D. The liquid conduits 260 carry a cooling fluid that further dissipates the heat by circulating the fluid away and into the secondary core 290. Here, the heat is further dissipated through the secondary core 290 itself, through the secondary thermoelectric modules 280A (not seen), 280B, 280C, 280D (not seen), and then through the secondary heat sinks 270A, 270B, 270C, 270D.

Third Embodiment

FIG. 5 is a perspective illustration of a heat transfer system 300 according to a third embodiment. As shown, the heat transfer system 300 may include a local cold core 310 and a remote cold core 390. The local cold core 310 and remote cold core 390 may be arranged in a substantially vertical stack, or the remote cold core 390 may be somewhat offset, as shown in FIG. 5. In operation, the system 300 may cool the electronic component 10 to sub-ambient temperatures.

The heat transfer system 300 of the third embodiment may include a plurality of local thermoelectric modules 320A, 320B, 320C, 320D in thermal communication with the local cold core 310. The system 300 may also include a plurality of local heat sinks 330A, 330B, 330C, 330D in thermal communication with the thermoelectric modules.

The remote cold core 390 may include a plurality of remote thermoelectric modules 380A, 380B (not seen), 380C (not seen), 380D and a plurality of remote heat sinks 370A, 370B, 370C, 370D. The system 300 may also include an air mover (not shown) and/or a duct (not shown) positioned adjacent the remote heat sinks. Any external surfaces of the local cold core 310 and the remote cold core 390 that are not in contact with a thermoelectric module, a heat sink, or another device may be thermally insulated (not shown).

Instead of having fins and using primarily air to facilitate heat transfer, the local heat sinks 330A, 330B, 330C, 330D in this third embodiment include embedded pipes through which a cooling fluid is circulated.

As shown in FIG. 5, the heat transfer system 300 of the third embodiment may include one or more pipes or liquid conduits 360H, 360C for facilitating the flow of a cooling fluid between one or more of the local heat sinks 330A, 330B, 330C, 330D and the remote cold core 390. In this aspect, the cooling fluid increases the cooling efficiency of the local heat sinks.

The liquid conduits 360H, 360C may define a substantially closed circuit for the cooling fluid. The cooling fluid may flow in response to convection, radiation, capillary action, wicking, or other natural force. Alternatively, the cooling fluid may be circulated by a mechanical force such as a pump 365. The liquid conduits may be generally cylindrical, as illustrated, or they may be partially flattened in cross-section, in order to conserve space and/or otherwise promote the natural circulation of the cooling fluid.

The heat transfer system 300 of the third embodiment may also include a radiator 375, as shown in FIG. 5, positioned between one or more of the local heat sinks and the remote cold core 390. In one aspect, the radiator 375 acts like another remote heat sink because it is positioned away from the primary cold core 310. The system 300 may also include an air mover (not shown) and/or a duct (not shown) positioned adjacent the radiator 375 in order to facilitate heat transfer.

When the heat transfer system 300 of the third embodiment is in operation, the local cold core 310 is positioned adjacent the electronic component 10 to be cooled. Heat dissipates through the local cold core 310, through the local thermoelectric modules 320A, 320B, 320C, 320D, and through the local heat sinks 330A, 330B, 330C, 30D. The liquid conduits 360H, 360C, carry a cooling fluid that further dissipates the heat by circulating the fluid away from and into the remote cold core 390. The liquid conduits 360H, 360C may be thermally insulated (not shown). As shown, the liquid conduits may include one or more conduits 360H for carrying relatively hot water away from the local heat sinks, and one or more conduits 360C for carrying relatively cool water back to the local heat sinks.

In the third embodiment, a pump 365 may be positioned and configured to cause the cooling fluid to flow through a substantially closed circuit, as shown in FIG. 5. The cooling fluid may pass through a radiator 375 where additional heat is dissipated before the fluid enters the remote cold core 390. There, heat is further dissipated through the remote cold core 390 itself, through the remote thermoelectric modules 380A, 380B, 380C, 380D, and then through the remote heat sinks 370A, 370B, 370C, 370D.

Fourth Embodiment

FIG. 6 is a perspective, partially exploded illustration of a heat transfer system 400 according to a fourth embodiment. As shown, the heat transfer system 400 may include one or more electronic components 10A, 10D, 10F to be cooled, an elongated cold core 410, a plurality of thermoelectric modules 420A (not seen), 420B, 420C, 420D (not seen), and a plurality of heat sinks 430A, 430B, 430C, 430D. The heat transfer system 400 may also include an air mover (not shown) to help increase the effectiveness of the heat sinks. The heat transfer system 400 may also include a duct (not shown) positioned to direct at least a portion of the flow of air toward a desired location.

The elongated cold core 410 of the heat transfer system 400 may be positioned atop an electronic component 10F, as shown, so that the cold core 410 is in thermal communication with the electronic component 10F. In this embodiment, the elongated cold core 410 may be elongate in shape such that one or more additional electronic components 10A, 10D may be positioned adjacent and in thermal communication with the cold core 410. For an elongated cold core 410 shaped like a cube or a rectangular prism, six outer surfaces are available, upon which any number of electronic components may be placed. The electronic components to be cooled may or may not be connected electrically to one another. Any external surfaces of the elongated cold core 410 that are not in contact with a thermoelectric module, a heat sink, or another device may be thermally insulated (not shown). In operation, the system 400 may cool the electronic components 10A, 10D, 10F to sub-ambient temperatures.

The elongated cold core 410 has a base, a generally opposing top surface, and at least one side surface. In one aspect, the base of the elongated cold core 410 defines a cavity (not shown) that is sized and shaped to receive an electronic component 10F. Also, as shown in FIG. 6, a side surface of the elongated cold core 410 may define a side cavity 415A that is sized and shaped to receive an electronic component 10A. Similarly, another side surface of the elongated cold core 410 may define a side cavity 415D that is sized and shaped to receive an electronic component 10D. The cavities in the elongated cold core 410 may sized and shaped to a close tolerance relative to the size and shape of the corresponding electronic component to be cooled on that particular side surface.

When the heat transfer system 400 of the fourth embodiment is in operation, the elongated cold core 410 is positioned adjacent the electronic components to be cooled. Heat dissipates through the elongate cold core 410, through the thermoelectric modules 420A (not seen), 420B, 420C, 420D (not seen), and through the heat sinks 430A, 430B, 430C, 430D.

CONCLUSION

Although the heat transfer systems are described herein in the context of cooling a small electronic component such as a microchip or microprocessor, the technology disclosed herein is also useful and applicable in other contexts. Moreover, although several embodiments have been described herein, those of ordinary skill in art, with the benefit of the teachings of this disclosure, will understand and comprehend many other embodiments and modifications for this technology. The invention therefore is not limited to the specific embodiments disclosed or discussed herein, and that may other embodiments and modifications are intended to be included within the scope of the appended claims. Moreover, although specific terms are occasionally used herein, as well as in the claims or concepts that follow, such terms are used in a generic and descriptive sense only, and should not be construed as limiting the described invention or the claims that follow.

The invention claimed is:

1. A system for cooling a plurality of microchips in a stack, the stack having one side engaged with a substrate and a plurality of unengaged sides, the system comprising:
    a cold core in thermal communication and direct contact with all of the unengaged sides of the stack, said cold core having a three-dimensional shape and comprising a base, a generally opposing top, and at least one side surface;

a plurality of solid state cooling devices each in thermal communication and in direct contact with said cold core;

a plurality of heat sinks, wherein each of said plurality of heat sinks is in thermal communication and direct contact with one of said plurality of solid state cooling devices; and an air mover positioned to produce a flow of air adjacent one or more of said plurality of heat sinks, wherein said system is configured to cool each microchip in the plurality of microchips to a sub-ambient temperature.

2. The system of claim 1, wherein said cold core comprises a solid three-dimensional shape selected from the group consisting of cube, polyhedron, prism, rectangular prism, cylindrical prism, pyramid, and amorphous.

3. The system of claim 1, wherein said base defines a cavity that is sized and shaped to receive the stack of microchips.

4. The system of claim 1, wherein said plurality of solid state cooling devices comprises at least four solid state cooling devices, and wherein said plurality of heat sinks comprises at least four heat sinks.

5. The system of claim 1, further comprising:
a duct positioned to direct at least a portion of said flow of air adjacent one or more of said plurality of heat sinks.

6. The system of claim 1, further comprising:
a secondary cold core spaced apart from said cold core in a substantially vertical stack;
a plurality of secondary solid state cooling devices each in thermal communication and direct contact with said secondary cold core;
a plurality of secondary heat sinks, wherein each of the plurality of secondary heat sinks is in thermal communication and direct contact with one of said plurality of secondary solid state cooling devices; and
one or more liquid conduits for facilitating the flow of a cooling fluid through a substantially closed circuit that extends between said secondary cold core and one or more of said plurality of heat sinks.

7. The system of claim 1, further comprising:
a remote cold core spaced apart from said cold core;
a plurality of remote solid state cooling devices each in thermal communication and direct contact with said remote cold core;
a plurality of remote heat sinks, wherein each of said plurality of remote heat sinks is in thermal communication and direct contact with one of said plurality of remote solid state cooling devices;
one or more liquid conduits for facilitating the flow of a cooling fluid through a substantially closed circuit that extends from between said remote cold core and one or more of said plurality of heat sinks; and
a pump that is positioned and configured to cause said cooling fluid to flow through said substantially closed circuit,
wherein one of said plurality of remote heat sinks comprises a radiator that is positioned between said remote cold core and one or more of said plurality of heat sinks.

8. The system of claim 1, wherein said stack comprises a plurality of stacks, each in thermal communication and direct contact with said cold core, and wherein one or more of said base, said top, and said at least one side surface of said cold core defines a plurality of cavities, each sized and shaped to receive one of said plurality of stacks.

9. A system for cooling an electronic component having one side engaged with a substrate and a plurality of unengaged sides, the system comprising:
a primary cold core in thermal communication with and positioned adjacent to all of the unengaged sides of the electronic component, said primary cold core comprising a base, a generally opposing top, and at least one side surface;
a plurality of primary solid state cooling devices each in thermal communication with and placed on an outer surface of said primary cold core;
a plurality of primary heat sinks, wherein each of said plurality of primary heat sinks is in thermal communication with one of said plurality of primary solid state cooling devices;
an air mover positioned to produce a flow of air adjacent one or more of said plurality of primary heat sinks;
a secondary cold core spaced apart from said primary cold core;
a plurality of secondary solid state cooling devices each in thermal communication with said secondary cold core;
a plurality of secondary heat sinks, wherein each of said plurality of secondary heat sinks is in thermal communication with one of said plurality of secondary solid state cooling devices; and
one or more liquid conduits for facilitating the flow of a cooling fluid through a substantially closed circuit that extends between said secondary cold core and one or more of said primary heat sinks.

10. The system of claim 9, wherein said electronic component comprises one or more electronic components, and wherein one or more of said base, said top, and said at least one side surface of said primary cold core defines a plurality of cavities, each sized and shaped to receive one of said one or more electronic components, such that each is in thermal communication with said primary cold core.

11. The system of claim 9, further comprising:
a duct positioned to direct at least a portion of said flow of air adjacent one or more of said plurality of primary and secondary heat sinks.

12. The system of claim 9, wherein said plurality of primary solid state cooling devices comprises at least four solid state cooling devices, and wherein said plurality of primary heat sinks comprises at least four heat sinks.

13. The system of claim 9, wherein said plurality of secondary solid state cooling devices comprises at least four solid state cooling devices, and wherein said plurality of secondary heat sinks comprises at least four heat sinks.

14. The system of claim 1, wherein each of said plurality of heat sinks is in direct contact with one of said plurality of solid state cooling devices and each of said plurality of solid state cooling devices is in direct contact with one of said plurality of heat sinks.

15. The system of claim 1, further comprising a thermal interface between said at least one said surface of said cold core and at least one of said plurality of solid state cooling devices.

16. A system for cooling a plurality of microchips in a stack, the stack having one side engaged with a substrate and a plurality of unengaged sides, the system comprising:
a cold core in thermal communication with and positioned adjacent to all of the unengaged sides of the stack, said cold core having a three-dimensional shape and comprising a base, a generally opposing top, and at least one side surface and the stack having a size and a shape and the cold core further comprising at least one cavity defined in the base and configured for receiving the stack and sized and shaped to a close tolerance to the size and shape of the stack;

a plurality of solid state cooling devices each in thermal communication with and placed on an outer surface of said cold core; and a plurality of heat sinks, wherein each of said plurality of heat sinks is positioned in thermal communication with one of said plurality of solid state cooling devices.

17. The system of claim 16, wherein each of said plurality of heat sinks is in direct contact with one of said plurality of solid state cooling devices and each of said plurality of solid state cooling devices is in direct contact with one of said plurality of heat sinks.

18. The system of claim 16, wherein said three-dimensional shape of said cold core is selected from the group consisting of cube and rectangular prism.

19. The system of claim 16, wherein said cold core is configured to dissipate heat away from said stack.

20. The system of claim 16, wherein the cold core is a solid cold core.

\* \* \* \* \*